(12) United States Patent
Izutani et al.

(10) Patent No.: US 11,874,332 B2
(45) Date of Patent: Jan. 16, 2024

(54) FAILURE DETECTION APPARATUS

(71) Applicant: DENSO TEN Limited, Kobe (JP)

(72) Inventors: Atsushi Izutani, Kobe (JP); Yoshihiro Nakao, Kobe (JP)

(73) Assignee: DENSO TEN Limited, Kobe (JP)

( * ) Notice: Subject to any disclaimer, the term of this patent is extended or adjusted under 35 U.S.C. 154(b) by 0 days.

(21) Appl. No.: 17/750,991

(22) Filed: May 23, 2022

(65) Prior Publication Data

US 2023/0204678 A1 Jun. 29, 2023

(30) Foreign Application Priority Data

Dec. 23, 2021 (JP) ................. 2021-209497

(51) Int. Cl.
*G01R 31/389* (2019.01)
*G01R 19/00* (2006.01)
*G01R 31/3835* (2019.01)
*G01R 31/385* (2019.01)

(52) U.S. Cl.
CPC ....... *G01R 31/389* (2019.01); *G01R 19/0084* (2013.01); *G01R 31/385* (2019.01); *G01R 31/3835* (2019.01)

(58) Field of Classification Search
None
See application file for complete search history.

(56) References Cited

U.S. PATENT DOCUMENTS 6,952,103 B2 * 10/2005 Herb .............. G01R 27/18
324/522
2004/0135696 A1 * 7/2004 Hasegawa ........ G01R 31/3835
320/136

FOREIGN PATENT DOCUMENTS

JP 2003-066090 A 3/2003
JP 2021-050964 A 4/2021

* cited by examiner

*Primary Examiner* — Jas A Sanghera
(74) *Attorney, Agent, or Firm* — Oliff PLC

(57) ABSTRACT

A failure detection apparatus includes: a first switch configured to be connected to a positive electrode of a battery; a second switch configured to be connected to a negative electrode of the battery; detection resistances that are connected in series between the first switch and the second switch; and a measurement circuit that measures a voltage of the detection resistances, wherein (i) both the first switch and the second switch are turned on to form a failure-detection series-connected circuit consisting of the battery and the detection resistances, and (ii) a failure detection mode is provided to detect a failure based on the voltage measured by the measurement circuit.

5 Claims, 9 Drawing Sheets

FAILURE DETECTION APPARATUS

BACKGROUND OF THE INVENTION

Field of the Invention

The invention relates to a failure detection apparatus.

Description of the Background Art

There is an insulation resistance detection apparatus that includes a measurement portion having a first switch connected to a positive electrode of a battery, a second switch connected to a negative electrode of the battery, detection resistances, and a measurement circuit that measures a voltage applied to the detection resistances and detects insulation resistances of the battery (for example, refer to Japanese Published Unexamined Patent Application No. 2003-66090).

The insulation resistance detection apparatus turns on one of the first switch and the second switch and turns off an other one of the first switch and the second switch to form a series-connected circuit consisting of the battery, the insulation resistances of the battery, and the detection resistances, and detects the insulation resistances of the battery based on the voltage measured by the measurement circuit.

However, the insulation resistance detection apparatus cannot detect the insulation resistances of the battery when the measurement portion that measures the voltage applied to the detection resistances is broken down.

SUMMARY OF THE INVENTION

According to one aspect of the invention, a failure detection apparatus includes: a first switch configured to be connected to a positive electrode of a battery; a second switch configured to be connected to a negative electrode of the battery; detection resistances that are connected in series between the first switch and the second switch; and a measurement circuit that measures a voltage of the detection resistances, wherein (i) both the first switch and the second switch are turned on to form a failure-detection series-connected circuit consisting of the battery and the detection resistances, and (ii) a failure detection mode is provided to detect a failure based on the voltage measured by the measurement circuit.

It is an object of the invention to provide an insulation resistance detection apparatus and a failure detection method capable of detecting a failure of a measurement portion that measures a voltage applied to detection resistances.

These and other objects, features, aspects and advantages of the invention will become more apparent from the following detailed description of the invention when taken in conjunction with the accompanying drawings.

DESCRIPTION OF THE EMBODIMENTS

An insulation resistance detection apparatus according to an embodiment will be described below in detail with reference to the accompanying drawings. In addition, this invention is not limited to the embodiment described below. The insulation resistance detection apparatus according to the embodiment that is also a failure detection apparatus is mounted on, for example, a vehicle traveling using a driving force of an electric motor, such as an electric vehicle, a hybrid vehicle, or the like.

A high voltage secondary battery (e.g., lithium ion battery) that outputs a high voltage of several 100 V or more is used for a battery that supplies an electric power to the electric motor of the vehicle. Such a battery may cause an electric shock due to an electric leakage.

Thus, the battery is stored in an insulating case, or the like, and is electrically insulated from an outside of the case. The case of the battery is an insulation member that comes into electrical contact with the battery. In a new condition, the case has a resistance value of several M $\Omega$ and hardly conducts electricity. However, an insulation performance of the case of the battery may deteriorate, for example, due to a secular change, and the like. As a result, the insulation resistance detection apparatus detects and monitors insulation resistances of the case that are insulation resistances of the battery.

[1. Configuration Example of Insulation Detection Apparatus]

Figure 1:
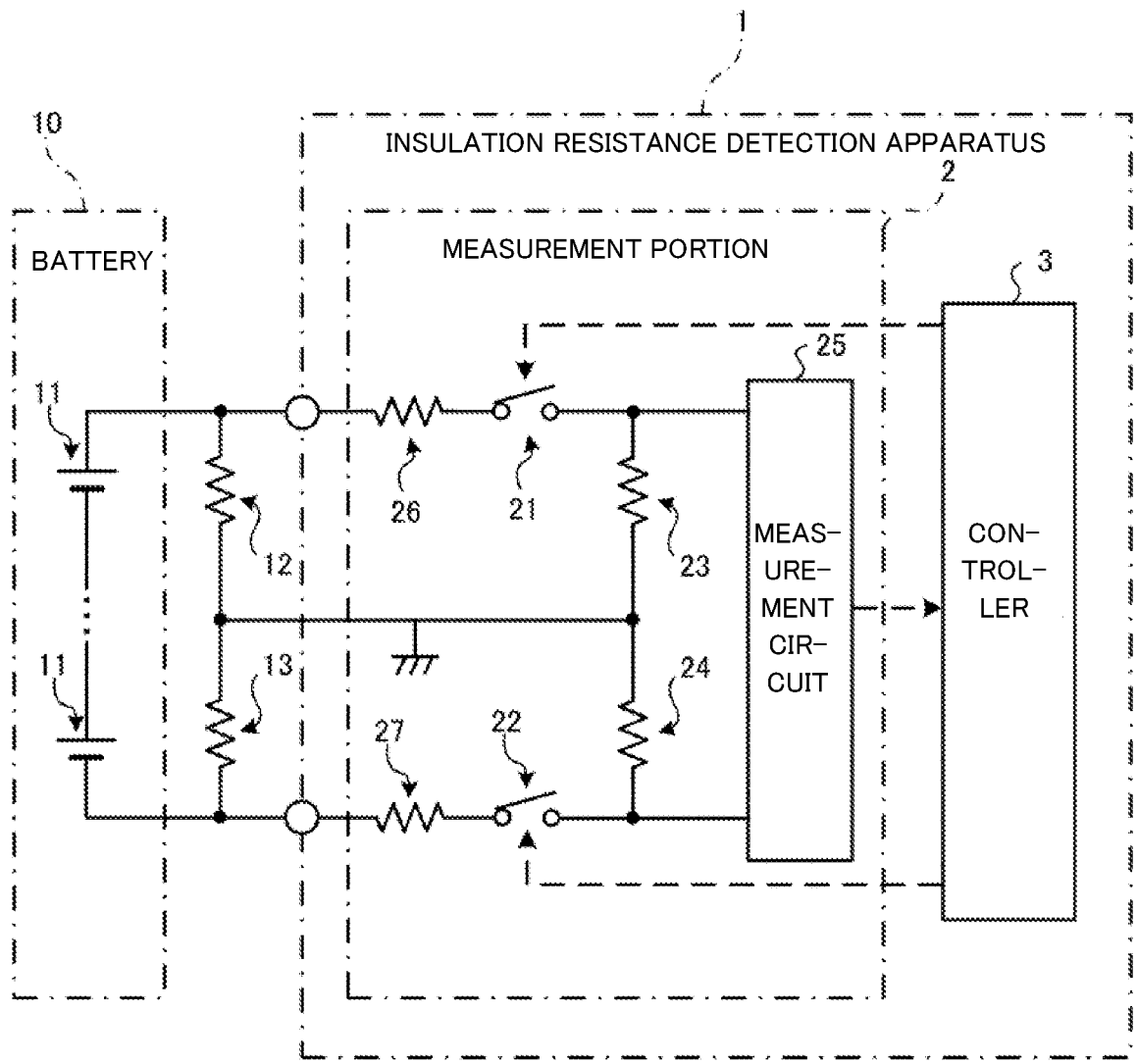
FIG. 1 is an explanation diagram illustrating a configuration example of an insulation resistance detection apparatus according to an embodiment.

FIG. 1 is an explanation diagram illustrating a configuration example of an insulation resistance detection apparatus 1 according to the embodiment. As illustrated in FIG. 1, the insulation resistance detection apparatus 1 is connected to a battery 10 via an insulation resistance 12 on a high voltage side and an insulation resistance 13 on a low voltage side. The battery 10 includes a plurality of battery cells 11 that are connected in series.

The insulation resistance 12 on the high voltage side and the insulation resistance 13 on the low voltage side are not resistance elements but a part of the insulating case in which the battery 10 is stored. The insulation resistance 12 on the high voltage side and the insulation resistance 13 on the low voltage may be resistance elements to be provided to electrically insulate the battery 10 from the outside of the battery 10.

The insulation resistance detection apparatus 1 includes a measurement portion 2 and a controller 3. The measurement portion 2 includes a first switch 21 to be connected to a positive electrode of the battery 10, a second switch 22 to be connected to a negative electrode of the battery 10, detection resistances 23, 24, and a measurement circuit 25 that measures a voltage applied to the detection resistances 23, 24. The measurement portion 2 further includes control resistances 26, 27.

The controller 3 includes a microcomputer having a CPU (Central Processing Unit), a ROM (Read Only Memory), a RAM (Random Access Memory), and the like, and various circuits. The controller 3, for example, the CPU uses the RAM as a work area to execute a program stored in the ROM. Thus, the controller 3 controls the first switch 21 and the second switch 22.

The controller 3 has a measurement mode that calculates the insulation resistances 12, 13, and a failure detection mode that checks the measurement portion 2. In the measurement mode, the controller 3 turns on one of the first switch 21 and the second switch 22, and turns off an other one of the first switch 21 and the second switch 22 to form a first series-connected circuit consisting of the battery 10, the insulation resistances 12, 13 of the battery 10, and the detection resistances 23, 24, and calculates the insulation resistances 12, 13 based on the voltage measured by the measurement circuit 25. In the failure detection mode, the controller 3 turns on both the first switch 21 and the second switch 22 to form a failure-detection series-connected circuit consisting of the battery 10 and the detection resistances 23, 24, and detects a failure of the measurement portion 2 based on the voltage measured by the measurement circuit 25.

A part or entire of the controller 3 may be constituted of hardware such as an ASIC (Application Specific Integrated Circuit) and an FPGA (Field Programmable Gate Array).

[2. Operation Example of Insulation Resistance Detection Apparatus]

Figure 2:
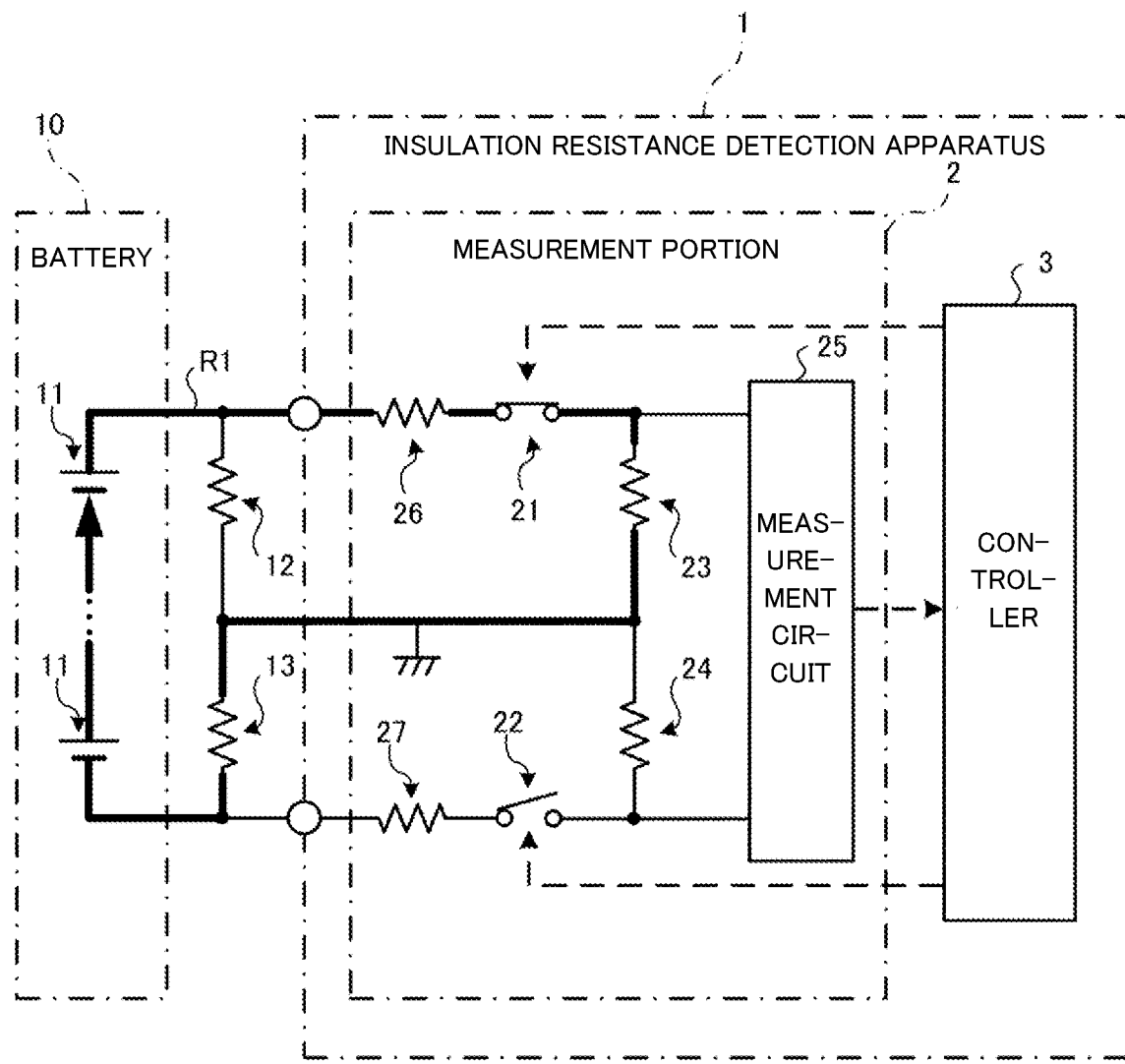
FIG. 2 is an explanation diagram illustrating an operation example of the insulation resistance detection apparatus according to the embodiment.
Figure 3:
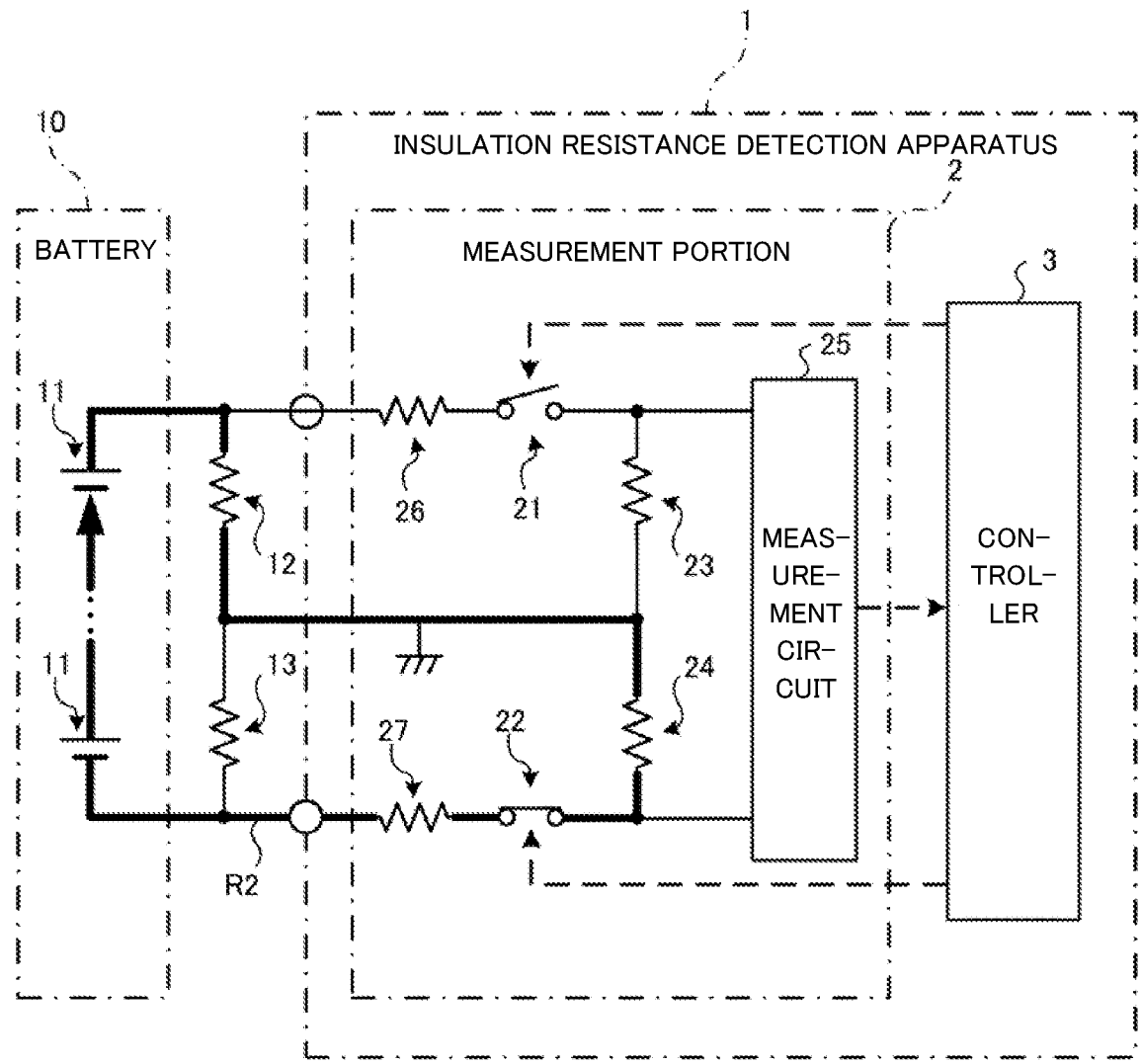
FIG. 3 is an explanation diagram illustrating an operation example of the insulation resistance detection apparatus according to the embodiment.

Next, operation examples of the insulation resistance detection apparatus 1 will be described with reference to FIG. 2 to FIG. 4. FIG. 2 and FIG. 3 are explanation diagrams illustrating the operation examples of the insulation resistance detection apparatus 1 according to the embodiment.

[2.1. Operation when Detecting Insulation Resistance]

For example, in the measurement mode, when detecting a resistance value of the insulation resistance 13 on the low voltage side, as illustrated in FIG. 2, the controller 3 turns on the first switch 21 and turns off the second switch 22 to form a first series-connected circuit R1 consisting of the battery 10, the control resistance 26, the detection resistance 23, and the insulation resistance 13 on the low voltage side. Then, the measurement circuit 25 measures the voltage applied to the detection resistance 23 (voltage difference between both ends of the detection resistance 23), and outputs the measurement result to the controller 3.

At this time, when the resistance value of the insulation resistance 13 on the low voltage side is sufficiently high, a current hardly flows through the first series-connected circuit R1. In this case, the voltage measured by the measurement circuit 25 has a value close to 0V. On the other hand, when the resistance value of the insulation resistance 13 on the low voltage side decreases, a current flows through the first series-connected circuit R1. Then, the voltage measured by the measurement circuit 25 has a higher value as the resistance value of the insulation resistance 13 on the low voltage side decreases.

Thus, the controller 3 calculates the resistance value of the insulation resistance 13 on the low voltage side based on the voltage measured by the measurement circuit 25. When the calculated resistance value is a predetermined resistance value or more, the controller 3 determines that there is no electric leakage. Furthermore, when the calculated resistance value is less than the predetermined resistance value, the controller 3 determines that there is an electric leakage. When the controller 3 has determined that there is an electric leakage, the controller 3 warns a user about the fact by a warning device such as a warning light.

For example, in the measurement mode, when detecting a resistance value of the insulation resistance 12 on the high voltage side, as illustrated in FIG. 3, the controller 3 turns off the first switch 21 and turns on the second switch 22 to form a second series-connected circuit R2 consisting of the battery 10, the insulation resistance 12 on the high voltage side, the detection resistance 24, and the control resistance 27. Then, the measurement circuit 25 measures the voltage applied to the detection resistance 24 (voltage difference between both ends of the detection resistance 24), and outputs the measurement result to the controller 3.

At this time, when the resistance value of the insulation resistance 12 on the high voltage side is sufficiently high, a current hardly flows through the second series-connected circuit R2. In this case, the voltage measured by the measurement circuit 25 has a value close to 0V. On the other hand, when the resistance value of the insulation resistance 12 on the high voltage side decreases, a current flows through the second series-connected circuit R2. Then, the voltage measured by the measurement circuit 25 has a higher value as the resistance value of the insulation resistance 12 on the high voltage side decreases.

Thus, the controller 3 calculates the resistance value of the insulation resistance 12 on the high voltage side based on the voltage measured by the measurement circuit 25. When the calculated resistance value is the predetermined resistance value or more, the controller 3 determines that there is no electric leakage. Furthermore, when the calculated resistance value is less than the predetermined resistance value, the controller 3 determines that there is an electric leakage. When the controller 3 has determined that there is an electric leakage, the controller 3 warns a user about the fact by a warning device such as a warning light.

As described above, since the insulation resistance detection apparatus 1 calculates the resistance values of the insulation resistances 12, 13 based on the voltage applied to the detection resistances 23, 24 measured by the measurement portion 2, when the measurement portion 2 is broken down, the resistance values of the insulation resistances 12, 13 cannot be calculated. Therefore, the controller 3 of the insulation resistance detection apparatus 1 according to the embodiment checks whether or not the measurement portion 2 is broken down before detecting the insulation resistances 12,13.

[2.2. Operation when Checking Failure of Measurement Portion]

Figure 4:
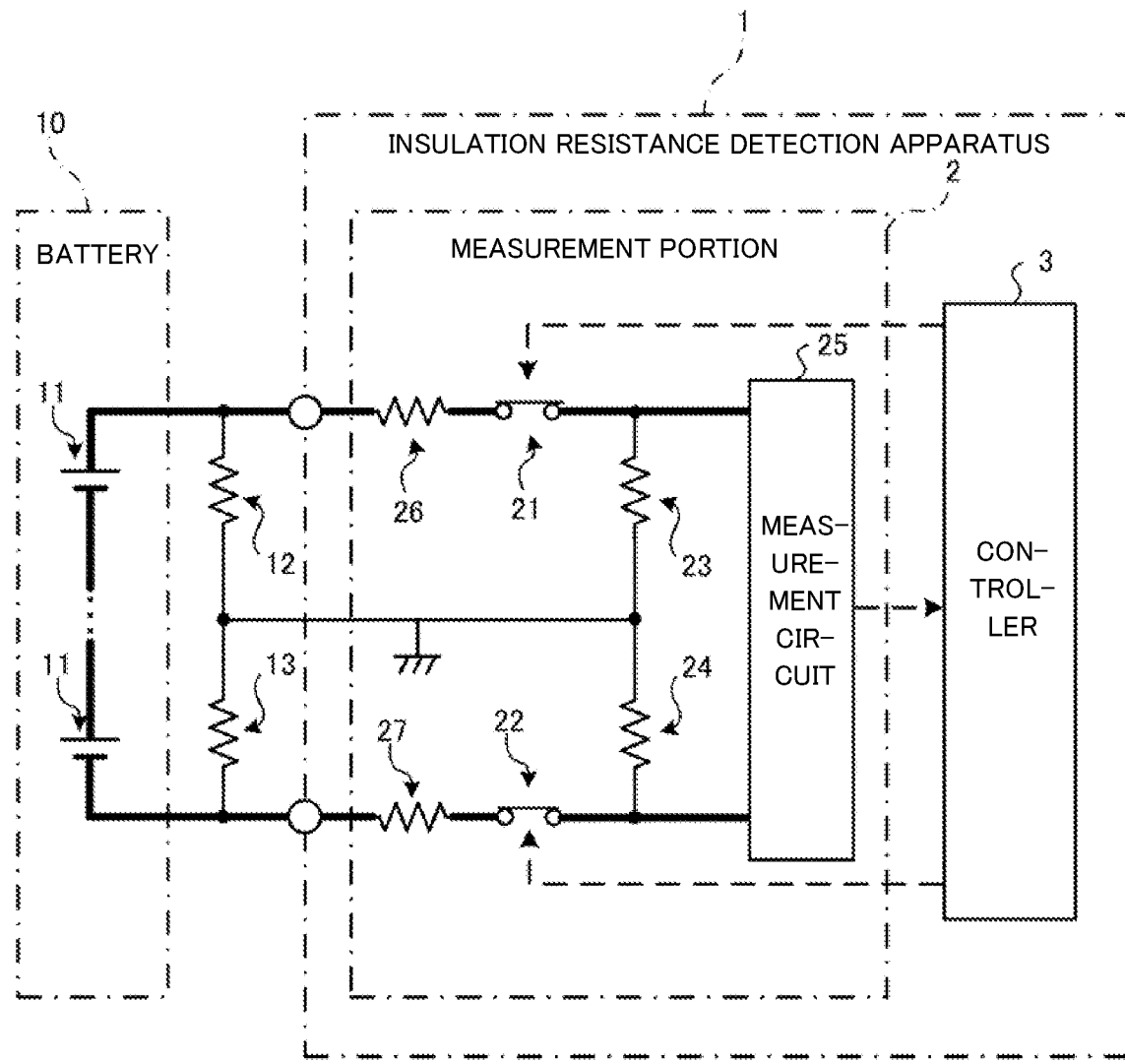
FIG. 4 is an explanation diagram illustrating an operation example of the insulation resistance detection apparatus according to the embodiment.

When checking the measurement portion 2, as illustrated in FIG. 4, the controller 3, in the failure detection mode, turns on the first switch 21 and the second switch 22 to form the failure-detection series-connected circuit consisting of the battery 10, and the detection resistances 23, 24, and detects a failure of the measurement portion 2 based on the voltage measured by the measurement circuit 25.

For example, when the measurement portion 2 is not broken down, if the first switch 21 and the second switch 22 are turned on, the measurement portion 2 outputs a voltage value corresponding to a voltage of the battery 10 to the controller 3 as the measurement result.

Specifically, when the voltage of the battery 10 is referred to as "V", and resistance values of the detection resistances 23, 24 and the control resistances 26, 27 are respectively referred to as "R23, R24, R26 and R27", the measurement portion 2 outputs a voltage value VX (R23+R24)/(R23+R24+R26+R27) obtained by dividing the voltage V of the battery 10 by the detection resistances 23, 24 to the controller 3.

On the other hand, when the measurement portion 2 is broken down, if the first switch 21 and the second switch 22 are turned on, the measurement portion 2 outputs a voltage value different from the voltage value corresponding to the voltage of the battery 10 to the controller 3 as the measurement result.

Thus, when the first switch 21 and the second switch 22 are turned on, if the voltage value corresponding to the voltage of the battery 10 is input from the measurement portion 2, the controller 3 determines that the measurement portion 2 is not broken down.

When the first switch 21 and the second switch 22 are turned on, if the voltage value different from the voltage value corresponding to the voltage of the battery 10 is input from the measurement portion 2, the controller 3 determines that the measurement portion 2 is broken down.

As described above, the controller 3 simultaneously turns on the first switch 21 and the second switch 22 that are alternately turned on and off to detect the insulation resistances 12, 13. At that time, only by detecting the measurement result that is input from the measurement portion 2, the failure of the measurement portion 2 can be detected.

[3. Configuration Example of Measurement Portion]

Figure 5:
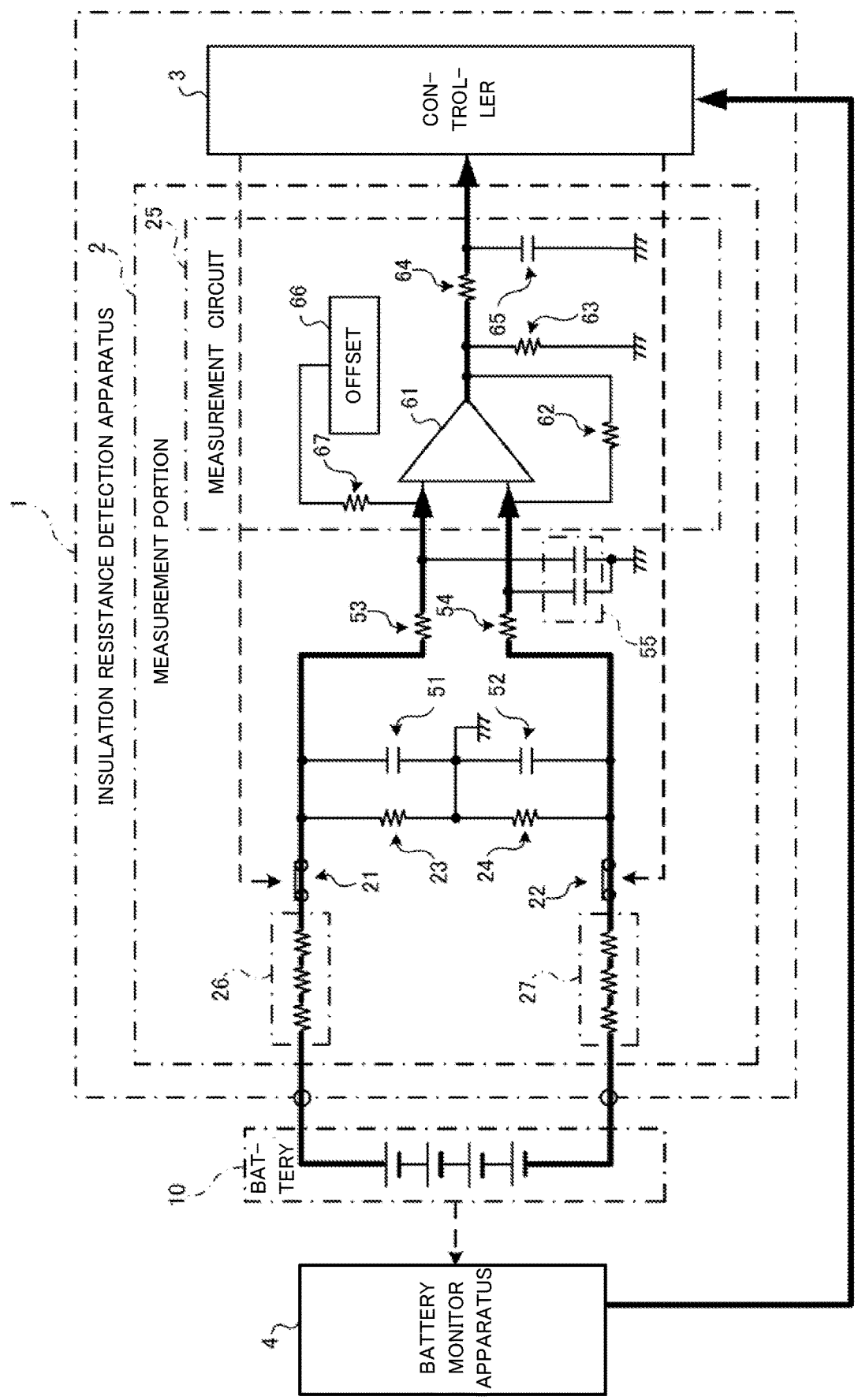
FIG. 5 is an explanation diagram illustrating a configuration example of a measurement portion according to the embodiment.

Next, an operation of the controller 3, and a specific example in which the measurement portion 2 may be broken down will be described with reference to FIG. 5, along with a specific configuration example of the measurement portion 2. FIG. 5 is an explanation diagram illustrating the configuration example of the measurement portion 2 according to the embodiment. In the configuration example illustrated in FIG. 5, the same constituent elements as those shown in FIG. 1 are denoted with the same reference numerals and a description thereof is omitted.

As illustrated in FIG. 5, the control resistances 26, 27 of the measurement portion 2 consist of a plurality of resistance elements that are connected in series, respectively. The measurement portion 2 includes capacitors 51, 52 that are respectively connected in parallel to the detection resistances 23, 24. The capacitors 51, 52 smooth noise components contained in the voltage applied to the detection resistances 23, 24.

The measurement circuit 25 includes a differential amplifier 61, a resistance 53 between the first switch 21 and the differential amplifier 61, and a resistance 54 between the second switch 22 and the differential amplifier 61. In the measurement circuit 25, capacitors 55 are respectively connected between a wire that connects the resistance 53 and the differential amplifier 61 and a ground, and between a wire that connects the resistance 54 and the differential amplifier 61 and the ground. The capacitors 55 smooth the noise components contained in the voltage input to the measurement circuit 25.

An offset voltage generator (offset 66) that applies an offset voltage via a resistance 67 is connected to a positive side input of the differential amplifier 61. An output of the differential amplifier 61 is fed back to a negative side input of the differential amplifier 61 via a resistance 62. The output of the differential amplifier 61 is connected to the controller 3 via a CR filter consisting of resistances 63, 64 and a capacitor 65.

The controller 3 is connected to a battery monitor apparatus 4 as one example of an external apparatus. The battery monitor apparatus 4 is an apparatus that monitors states of the battery 10 including the voltage of the battery 10, SOC (State Of Charge), and the like. When the controller 3 detects the failure of the measurement portion 2, the controller 3 receives and acquires the voltage of the battery 10 from the battery monitor apparatus 4.

The controller 3 turns on the first switch 21 and the second switch 22, and compares the measurement result of the voltage of the battery 10 that is input from the measurement portion 2 with the voltage of the battery 10 that is input from the battery monitor apparatus 4. When the measurement result of the measurement portion 2, i.e., the voltage of the battery 10 obtained by calculating backward from the voltage applied to the detection resistances 23, 24 is approximately equal to the voltage of the battery 10 that is acquired from the battery monitor apparatus 4, the controller 3 determines that the measurement portion 2 is not broken down. The phrase "approximately equal" includes a case in which the two voltages completely correspond to each other and a case in which the controller 3 determines to be normal even when there is some difference between the two voltages.

On the other hand, for example, when the voltage of the battery 10 is actually several 100 V, if the measurement result of the measurement portion 2 is 0 V, there may be open failures of the control resistances 26, 27, and the resistances 53, 54, 64 and open failures of the first switch 21 and the second switch 22, and short failures of the resistance 63 and the capacitors 55, 65. Furthermore, for example, when the voltage of the battery 10 is greatly different from the measurement result of the measurement portion 2, a gain of the differential amplifier 61 may have abnormalities.

Thus, when a difference between the measurement result of the measurement portion 2, i.e., the voltage of the battery 10 obtained from the voltage applied to the detection resistances 23, 24, and the voltage of the battery 10 that is acquired from the battery monitor apparatus 4 exceeds a predetermined threshold value, the controller 3 determines the measurement portion is broken down.

As described above, the controller 3 simultaneously turns on the first switch 21 and the second switch 22, and compares the measurement result that is input from the measurement portion 2 with the voltage of the battery 10 that is acquired from the battery monitor apparatus 4. As a result, it is possible to detect the failure of the measurement portion 2.

In the example described above, the controller 3 compares the voltage of the battery 10 obtained from the measurement result of the measurement portion 2 with the voltage of the battery 10 that is acquired from the battery monitor apparatus 4 to determine the failure of the measurement portion 2. Instead of it, the voltage of the battery 10 that is acquired from the battery monitor apparatus 4 may be divided by an expression (R23+R24)/(R23+R24+R26+R27) to become the voltage applied to the detection resistances 23, 24, and the resultant value may be compared with the measurement result of the measurement portion 2. In this case, when a voltage obtained by dividing the voltage of the battery 10 received from the battery monitor apparatus 4 at a predetermined diving ratio is approximately equal to the voltage measured by the measurement circuit 25, the controller 3 determines that there is no failure of the measurement portion 2.

[4. Process Executed by Controller]

Next, processes executed by the controller 3 of the insulation resistance detection apparatus 1 will be described with reference to FIG. 6 and FIG. 7. Each of FIG. 6 and FIG.

7 is a flowchart illustrating one example of a process executed by the controller 3 according to the embodiment. The controller 3 sequentially and repeatedly executes the processes illustrated in FIG. 6 and FIG. 7 in a period in which a power source of the vehicle is turned on.

Figure 6:
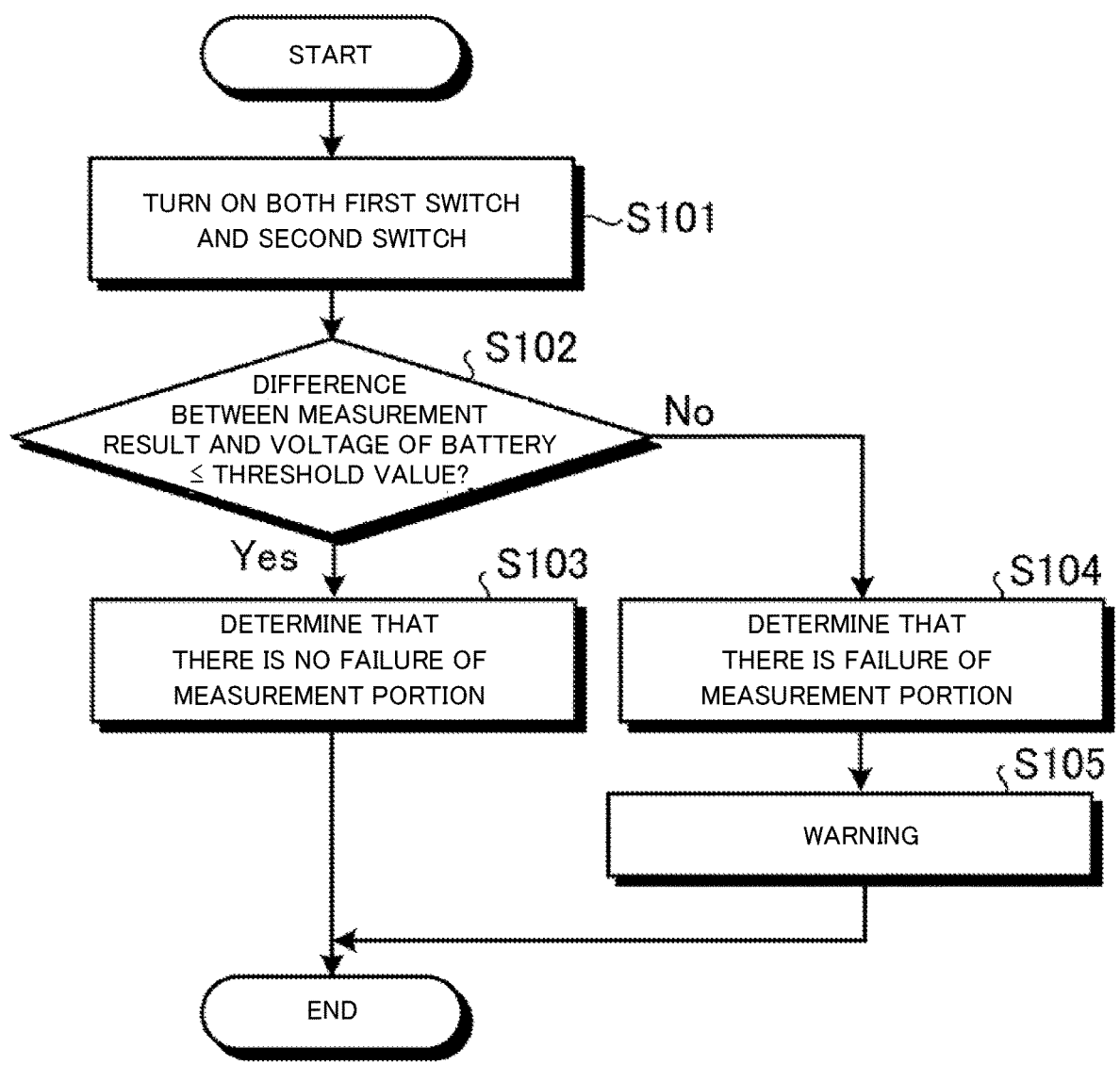
FIG. 6 is a flowchart illustrating one example of a process executed by a controller according to the embodiment.

Specifically, the controller 3 starts the process illustrated in FIG. 6 as the failure detection mode. As illustrated in FIG. 6, the controller 3 first turns on both the first switch 21 and the second switch 22 (a step S101). Then, the controller 3 determines whether or not the difference between the measurement result of the voltage by the measurement portion 2 and the voltage of the battery 10 that is acquired from the battery monitor apparatus 4 is a threshold value or lower (a step S102).

When the controller 3 has determined that the difference between the measurement result and the voltage of the battery 10 is the threshold value or lower (Yes in the step S102), the controller 3 determines that there is no failure of the measurement portion 2 (a step S103). Furthermore, when the controller 3 has determined that the difference between the measurement result by the measurement portion 2 and the voltage of the battery 10 is not the threshold value or lower (No in the step S102), the controller 3 determines that there is a failure of the measurement portion 2 (a step S104), and warns a user about the fact (a step S105).

Subsequently, the controller 3 starts the process illustrated in FIG. 7 as the measurement mode. Specifically, the controller 3, as illustrated in FIG. 7, first turns on the first switch 21 and turns off the second switch 22 to form the first series-connected circuit R1 (a step S201). Then, the controller 3 calculates an insulation resistance value of the insulation resistance 13 from the voltage measured by the measurement portion 2 (a step S202), and determines whether or not the insulation resistance value is the predetermined resistance value or more, that is, the resistance value that has no problem with an insulation of the battery 10 (a step S203).

When the controller 3 has determined that the insulation resistance value is the predetermined resistance value or more (Yes in the step S203), the controller 3 determines that there is no electric leakage (a step S204). Subsequently, the controller 3 turns off the first switch 21 and turns on the second switch 22 to form the second series-connected circuit R2 (a step S205).

Then, the controller 3 calculates an insulation resistance value of the insulation resistance 12 from the voltage measured by the measurement portion 2 (a step S206), and determines whether or not the insulation resistance value has no problem with the insulation of the battery 10, that is, the insulation value is the predetermined resistance value or more (a step S207).

When the controller 3 has determined that the insulation resistance value is the predetermined resistance value or more (Yes in the step S207), the controller 3 determines that there is no electric leakage (a step S208), ends the process, and restarts the process from the step S101 illustrated in FIG. 6.

Furthermore, in the step S203 or the step S207, when the controller 3 has determined that the insulation resistance value is not the predetermined resistance value or more (No in the step S203 or No in the step S207), the controller 3 determines that there is an electric leakage (a step S209). Subsequently, the controller 3 warns a user about the electric leakage (a step S 210), ends the process, and restarts the process from the step S101 illustrated in FIG. 6.

[5. Modification Example of Insulation Resistance Detection Apparatus]

Figure 8:
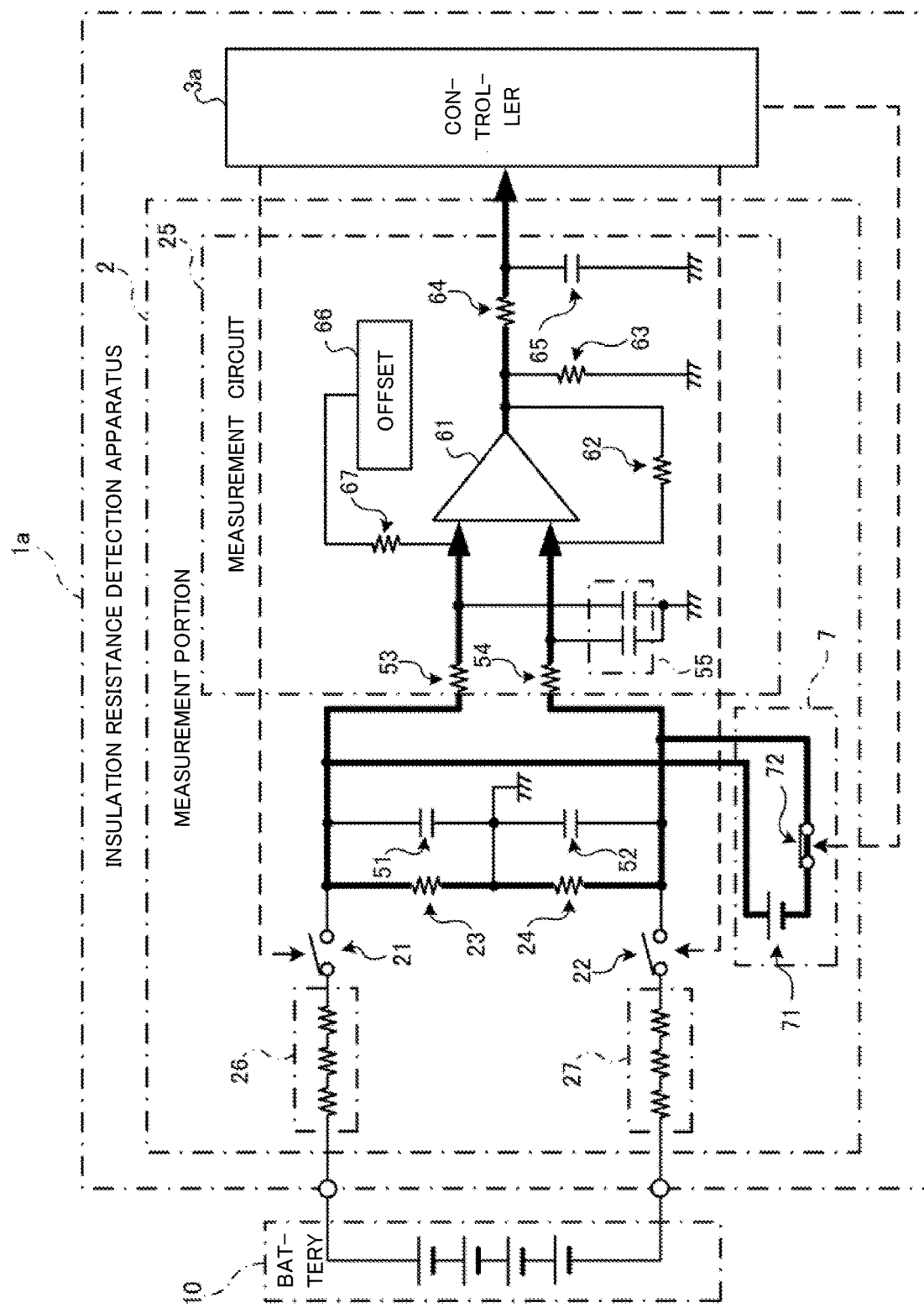
FIG. 8 is an explanation diagram illustrating a configuration example of an insulation resistance detection apparatus according to a modification example of the embodiment.

Next, an insulation resistance detection apparatus according to a modification example will be described with reference to FIG. 8. FIG. 8 is an explanation diagram illustrating a configuration example of an insulation resistance detection apparatus 1a according to the modification example of the embodiment. Here, in the configuration example illustrated in FIG. 8, the same constituent elements as those shown in FIG. 5 are denoted with the same reference numerals and a description thereof is omitted.

As illustrated in FIG. 8, the insulation resistance detection apparatus 1a further includes a voltage generator 7 configured to apply a known fixed voltage to detection resistances 23, 24 in addition to the configuration of the insulation resistance detection apparatus 1 illustrated in FIG. 5. The voltage generator 7 includes a fixed voltage source 71 that outputs the fixed voltage and a third switch 72.

When a controller 3a of the insulation resistance detection apparatus 1a detects a failure of a measurement circuit 25, in the failure detection mode, the controller 3a turns off a first switch 21 and a second switch 22 to form a failure-detection series-connected circuit consisting of the voltage generator 7 and the detection resistances 23, 24 and controls the voltage generator 7 to apply the fixed voltage to the detection resistances 23, 24. The controller 3a detects the failure of a measurement portion 2 based on the voltage measured by the measurement circuit 25.

Specifically, the controller 3a turns off the first switch 21 and the second switch 22, and turns on the third switch 72. When the voltage measured by the measurement circuit 25 is a voltage corresponding to the known fixed voltage (when the voltage measured by the measurement circuit 25 is approximately equal to the known fixed voltage), the controller 3a determines that there is no failure of the measurement circuit 25.

At this time, the controller 3a estimates the voltage applied to the detection resistances 23, 24 from the voltage measured by the measurement circuit 25. When a difference between the estimated voltage and the known fixed voltage is less than a threshold value, the controller 3a determines that there is no failure of the measurement circuit 25.

When the difference between the estimated voltage and the known fixed voltage is the threshold value or more, the controller 3a determines that there is a failure of the measurement circuit 25. As a result, the controller 3a determines whether or not the measurement circuit 25 is broken down in the measurement portion 2.

[6. Process Executed by Controller According to Modification Example]

Figure 9:
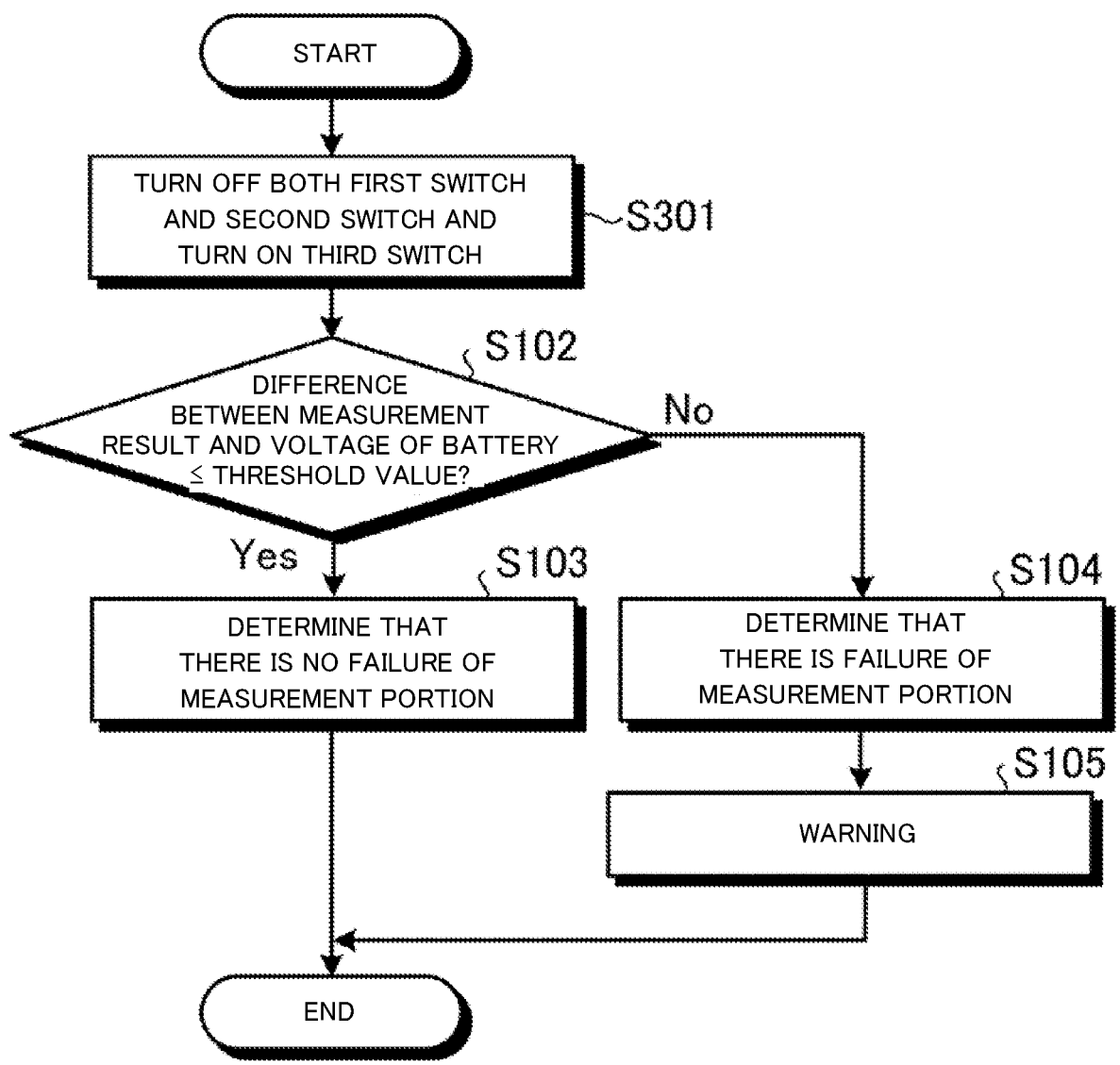
FIG. 9 is a flowchart illustrating one example of a process executed by a controller according to the modification example of the embodiment.

Next, a process executed by the controller 3a according to the modification example will be described with reference to FIG. 9. FIG. 9 is a flowchart illustrating the process executed by the controller 3a according to the modification example of the embodiment.

Figure 7:
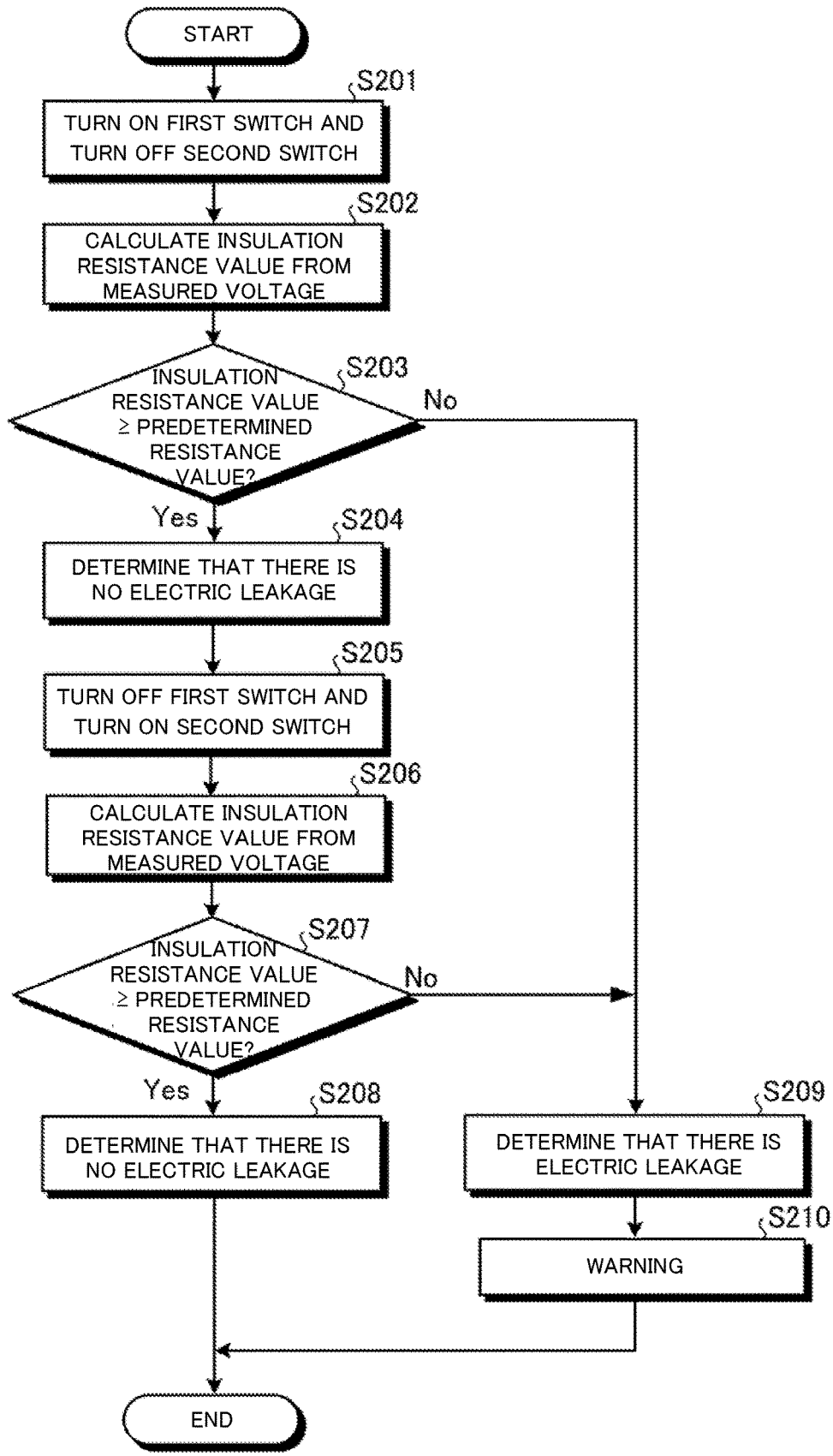
FIG. 7 is a flowchart illustrating one example of the process executed by the controller according to the embodiment.

The controller 3a performs the process illustrated in FIG. 9 as the failure detection mode instead of the process illustrated in FIG. 6 out of the processes illustrated in FIG. 6 and FIG. 7. That is, the controller 3a sequentially and repeatedly executes the processes illustrated in FIG. 9 and FIG. 7.

As illustrated in FIG. 9, the controller 3a first turns off both the first switch 21 and the second switch 22, and turns on the third switch 72 (a step S301). Subsequently, the controller 3a executes the same processes as those of the steps S102 to S105 illustrated in FIG. 6.

By these processes, the controller 3a determines that there is no failure of the measurement circuit 25 of the measurement portion 2 in the step S103. Furthermore, the controller 3a determines that there is a failure of the measurement circuit 25 of the measurement portion 2 in the step S104.

It is possible for a person skilled in the art to easily come up with more effects and modifications. Thus, a broader modification of this invention is not limited to specific description and typical embodiments described and expressed above. Therefore, various modifications are possible without departing from the general spirit and scope of the invention defined by claims attached and equivalents thereof.

While the invention has been shown and described in detail, the foregoing description is in all aspects illustrative and not restrictive. It is therefore understood that numerous other modifications and variations can be devised without departing from the scope of the invention.

As to implementations containing the above embodiments, following supplements are further disclosed.

1. A failure detection apparatus includes:
   a first switch configured to be connected to a positive electrode of a battery;
   a second switch configured to be connected to a negative electrode of the battery;
   detection resistances that are connected in series between the first switch and the second switch; and
   a measurement circuit that measures a voltage of the detection resistances, wherein
   (i) both the first switch and the second switch are turned on to form a failure-detection series-connected circuit consisting of the battery and the detection resistances, and (ii) a failure detection mode is provided to detect a failure based on the voltage measured by the measurement circuit.

2. The failure detection apparatus according to supplement 1, wherein
   (i) one of the first switch and the second switch is turned on, and an other one of the first switch and the second switch is turned off to form a first series-connected circuit consisting of the battery, insulation members that come into electrical contact with the battery, and the detection resistances, and (ii) a measurement mode is provided to calculate an insulation resistance of the insulation members based on the voltage measured by the measurement circuit.

3. The failure detection apparatus according to supplement 1, wherein
   a failure is detected based on a voltage of the battery received from an external apparatus and the voltage measured by the measurement circuit for the failure-detection series-connected circuit.

4. The failure detection apparatus according to supplement 3, wherein
   a voltage of the battery is calculated based on the voltage measured by the measurement circuit for the failure-detection series-connected circuit, and when the calculated voltage of the battery is approximately equal to the voltage of the battery received from the external apparatus, it is determined that there is no failure.

5. The failure detection apparatus according to supplement 3, wherein
   when a voltage obtained by dividing the voltage of the battery received from the external apparatus at a predetermined dividing ratio is approximately equal to the voltage measured by the measurement circuit for the failure-detection series-connected circuit, it is determined that there is no failure.

6. A failure detection apparatus includes:
   a measurement portion that includes a first switch configured to be connected to a positive electrode of a battery, a second switch configured to be connected to a negative electrode of the battery, detection resistances, and a measurement circuit that measures a voltage applied to the detection resistances; and
   a controller that (i) turns on one of the first switch and the second switch, and turns off an other one of the first switch and the second switch to form a first series-connected circuit consisting of the battery, insulation resistances of the battery, and the detection resistances, and (ii) calculates the insulation resistances based on the voltage measured by the measurement circuit for the first series-connected circuit, wherein
   the controller (a) turns on both the first switch and the second switch to form a failure-detection series-connected circuit consisting of the battery and the detection resistances, and (b) detects a failure of the measurement portion based on the voltage measured by the measurement circuit for the failure-detection series-connected circuit.

7. The failure detection apparatus according to supplement 6, wherein
   the controller detects the failure of the measurement portion based on a voltage of the battery received from an external apparatus and the voltage measured by the measurement circuit for the failure-detection series-connected circuit.

8. The failure detection apparatus according to supplement 7, wherein
   the controller calculates a voltage of the battery based on the voltage measured by the measurement circuit for the failure-detection series-connected circuit, and when the calculated voltage of the battery is approximately equal to the voltage of the battery received from the external apparatus, the controller determines that there is no failure of the measurement portion.

9. The failure detection apparatus according to supplement 7, wherein
   when a voltage obtained by dividing the voltage of the battery received from the external apparatus at a predetermined dividing ratio is approximately equal to the voltage measured by the measurement circuit for the failure-detection series-connected circuit, the controller determines that there is no failure of the measurement portion.

10. A failure detection apparatus includes:
    a first switch configured to be connected to a positive electrode of a battery;
    a second switch configured to be connected to a negative electrode of the battery;
    detection resistances that are connected in series between the first switch and the second switch;
    a measurement circuit that measures a voltage of the detection resistances; and
    a voltage generator configured to apply a fixed voltage to the detection resistances, wherein
    (i) both the first switch and the second switch are turned off to form a failure-detection series-connected circuit consisting of the voltage generator and the detection resistances, and (ii) the voltage generator is controlled to apply the fixed voltage to the detection resistances to detect a failure based on the voltage measured by the measurement circuit for the failure-detection series-connected circuit.

11. The failure detection apparatus according to supplement 10, wherein
(i) one of the first switch and the second switch is turned on, and an other one of the first switch and the second switch is turned off to form a first series-connected circuit consisting of the battery, insulation members that come into electrical contact with the battery, and the detection resistances, and (ii) a measurement mode is provided to calculate an insulation resistance of the insulation members based on the voltage measured by the measurement circuit.

12. The failure detection apparatus according to supplement 10, wherein
when the voltage measured by the measurement circuit for the failure-detection series-connected circuit is a voltage corresponding to the fixed voltage, it is determined that there is no failure.

13. An insulation resistance detection apparatus includes:
a measurement portion that includes a first switch configured to be connected to a positive electrode of a battery, a second switch configured to be connected to a negative electrode of the battery, detection resistances, and a measurement circuit that measures a voltage applied to the detection resistances;
a controller that (i) turns on one of the first switch and the second switch, and turns off an other one of the first switch and the second switch to form a first series-connected circuit consisting of the battery, insulation resistances of the battery, and the detection resistances, and (ii) calculates the insulation resistances based on the voltage measured by the measurement circuit for the first series-connected circuit; and
a voltage generator configured to apply a fixed voltage to the detection resistances, wherein
the controller (a) turns off both the first switch and the second switch to form a failure-detection series-connected circuit consisting of the voltage generator and the detection resistances, and (b) controls the voltage generator to apply the fixed voltage to the detection resistances to detect a failure of the measurement portion based on the voltage measured by the measurement circuit for the failure-detection series-connected circuit.

14. The insulation resistance detection apparatus according to supplement 13, wherein
when the voltage measured by the measurement circuit for the failure-detection series-connected circuit is a voltage corresponding to the fixed voltage, the controller determines that there is no failure of the measurement portion.

15. A failure detection method executed by an insulation resistance detection apparatus that includes: (A) a measurement portion that includes a first switch connected to a positive electrode of a battery, a second switch connected to a negative electrode of the battery, detection resistances, and a measurement circuit that measures a voltage applied to the detection resistances; and (B) a controller that (i) turns on one of the first switch and the second switch, and turns off an other one of the first switch and the second switch to form a first series-connected circuit consisting of the battery, insulation resistances of the battery, and the detection resistances, and (ii) calculates the insulation resistances based on the voltage measured by the measurement circuit for the first series-connected circuit, the method comprising the steps of:

(a) turning on both the first switch and the second switch to form a failure-detection series-connected circuit consisting of the battery and the detection resistances; and
(b) detecting a failure of the measurement portion based on the voltage measured by the measurement circuit for the failure-detection series-connected circuit.

16. A failure detection method executed by an insulation resistance detection apparatus that includes: (A) a measurement portion that includes a first switch connected to a positive electrode of a battery, a second switch connected to a negative electrode of the battery, detection resistances, and a measurement circuit that measures a voltage applied to the detection resistances; (B) a controller that (i) turns on one of the first switch and the second switch, and turns off an other one of the first switch and the second switch to form a first series-connected circuit consisting of the battery, insulation resistances of the battery, and the detection resistances, and (ii) calculates the insulation resistances based on the voltage measured by the measurement circuit for the first series-connected circuit; and (C) a voltage generator configured to apply a fixed voltage to the detection resistances, the method comprising the steps of:

(a) turning off both the first switch and the second switch to form a failure-detection series-connected circuit consisting of the voltage generator and the detection resistances; and
(b) controlling the voltage generator to apply the fixed voltage to the detection resistances to detect a failure of the measurement portion based on the voltage measured by the measurement circuit for the failure-detection series-connected circuit.

What is claimed is:
1. A failure detection apparatus comprising:
a first switch configured to be connected to a positive electrode of a battery;
a second switch configured to be connected to a negative electrode of the battery;
detection resistances that are connected in series between the first switch and the second switch;
a measurement circuit that measures a voltage of the detection resistances; and
a controller configured to:
(i) turn on both the first switch and the second switch to form a failure-detection series-connected circuit consisting of the battery and the detection resistances, and (ii) operate in a failure detection mode with the first and second switches turned on to detect a failure based on the voltage measured by the measurement circuit, wherein the failure detection mode includes the controller:
calculating a voltage of the battery based on the voltage measured by the measurement circuit for the failure-detection series-connected circuit,
detecting a failure by comparing the calculated voltage of the battery to a voltage of the battery received from an external apparatus that is external to the failure detection apparatus, and
determining that there is no failure when the calculated voltage of the battery is approximately equal to the voltage of the battery received from the external apparatus.

2. The failure detection apparatus according to claim 1, wherein the controller is further configured to:
(i) turn on one of the first switch and the second switch, and turn off an other one of the first switch and the second switch to form a first series-connected circuit consisting of the battery, insulation members that come into electrical contact with the battery, and the detection resistances, and (ii) operate in a measurement mode to calculate an insulation resistance of the insulation members based on the voltage measured by the measurement circuit.

3. A failure detection apparatus comprising:
a first switch configured to be connected to a positive electrode of a battery;
a second switch configured to be connected to a negative electrode of the battery;
detection resistances that are connected in series between the first switch and the second switch;
a measurement circuit that measures a voltage of the detection resistances; and
a controller configured to:
(i) turn on both the first switch and the second switch to form a failure-detection series-connected circuit consisting of the battery and the detection resistances, and (ii) operate in a failure detection mode with the first and second switches turned on to detect a failure based on the voltage measured by the measurement circuit, wherein the failure detection mode includes the controller:
detecting a failure based on the calculated voltage of the battery and a voltage of the battery received from an external apparatus that is external to the failure detection apparatus, and
determining that there is no failure when a voltage obtained by the controller dividing the voltage of the battery received from the external apparatus by a predetermined dividing ratio is approximately equal to the voltage measured by the measurement circuit for the failure-detection series-connected circuit.

4. The failure detection apparatus according to claim 3, wherein the controller is further configured to:
(i) turn on one of the first switch and the second switch, and turn off an other one of the first switch and the second switch to form a first series-connected circuit consisting of the battery, insulation members that come into electrical contact with the battery, and the detection resistances, and (ii) operate in a measurement mode to calculate an insulation resistance of the insulation members based on the voltage measured by the measurement circuit.

5. A failure detection apparatus comprising:
a measurement portion that includes a first switch configured to be connected to a positive electrode of a battery, a second switch configured to be connected to a negative electrode of the battery, detection resistances, and a measurement circuit that measures a voltage applied to the detection resistances; and
a controller that (i) turns on one of the first switch and the second switch, and turns off an other one of the first switch and the second switch to form a first series-connected circuit consisting of the battery, insulation resistances of the battery, and the detection resistances, and (ii) calculates the insulation resistances based on the voltage measured by the measurement circuit for the first series-connected circuit, wherein
the controller (a) turns on both the first switch and the second switch to form a failure-detection series-connected circuit consisting of the battery and the detection resistances, and (b) detects a failure of the measurement portion by comparing the voltage measured by the measurement circuit for the failure-detection series-connected circuit to a voltage of the battery received from an external apparatus that is external to the failure detection apparatus, and
the controller calculates a voltage of the battery based on the voltage measured by the measurement circuit for the failure-detection series-connected circuit, and when the calculated voltage of the battery is approximately equal to the voltage of the battery received from the external apparatus, the controller determines that there is no failure of the measurement portion.

* * * * *